US006385265B1

(12) United States Patent
Duffy et al.

(10) Patent No.: US 6,385,265 B1
(45) Date of Patent: May 7, 2002

(54) DIFFERENTIAL CHARGE PUMP

(75) Inventors: Michael L. Duffy; Bertrand J. Williams; Phillip J. Kruczkowski; Jaideep Prakash; Nathan Y. Moyal, all of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/128,901

(22) Filed: Aug. 4, 1998

(51) Int. Cl.$^7$ ................................................ H03D 3/24
(52) U.S. Cl. ........................ 375/374; 327/148; 327/150
(58) Field of Search ................................ 375/374, 375, 375/376, 377, 226; 326/136, 82, 99, 96; 327/148, 147, 150, 157, 159, 536, 537, 563; 331/8, 10, 25

(56) References Cited

U.S. PATENT DOCUMENTS

| 4,692,718 A | | 9/1987 | Roza et al. ............... 331/113 R |
| 4,884,042 A | | 11/1989 | Menon et al. ............ 331/113 R |
| 5,101,117 A | | 3/1992 | Johnson et al. .............. 307/269 |
| 5,103,191 A | | 4/1992 | Werker ........................ 331/1 A |
| 5,412,349 A | | 5/1995 | Young et al. .................. 331/34 |
| 5,446,867 A | | 8/1995 | Young et al. ................ 395/550 |
| 5,477,193 A | * | 12/1995 | Burchfield ...................... 331/8 |
| 5,495,207 A | | 2/1996 | Novof .......................... 331/57 |
| 5,550,493 A | | 8/1996 | Miyanishi ..................... 327/66 |
| 5,619,161 A | | 4/1997 | Novof et al. ................. 327/535 |
| 5,621,374 A | | 4/1997 | Harkin ........................ 337/151 |
| 5,631,591 A | | 5/1997 | Bar-Niv ....................... 327/158 |
| 5,677,648 A | * | 10/1997 | Jones .......................... 331/17 |
| 5,736,880 A | | 4/1998 | Bruccoleri et al. ......... 327/157 |
| 5,736,892 A | | 4/1998 | Lee ............................. 327/536 |
| 5,740,213 A | | 4/1998 | Dreyer ........................ 375/374 |
| 5,828,262 A | * | 10/1998 | Rees ........................... 327/390 |
| 5,903,195 A | * | 5/1999 | Lukes et al. ................... 331/4 |
| 6,043,695 A | * | 3/2000 | O'Sullivan .................. 327/157 |

OTHER PUBLICATIONS

Johnson et al., A variable Delay Line PLL for CPU–Coprocessor Synchronization, Oct. 1988, pp. 333–338.
Young et al., A PLL Clock Generator with 5 to 110 MHz of Lock Range for Microprocessors, Nov. 1992, pp. 1599–1607.

* cited by examiner

*Primary Examiner*—Jean Corrielus
*Assistant Examiner*—Emmanuel Bayard
(74) *Attorney, Agent, or Firm*—Christopher P. Maiorana, P.C.

(57) ABSTRACT

A circuit and method comprising a charge pump having a first and a second differential element. The charge pump may be configured to generate a first and a second output signal in response to the first and second differential elements. The first differential element may comprise (i) a first unity gain buffer and (ii) a first and a second transistor pair configured to receive a first and second control signal. The second differential element may comprise (i) a second unity gain buffer and (ii) a third and a fourth transistor pair configured to receive the first and second control signals. The first and second unity gain buffers may stabilize the source nodes of each of the transistors pairs.

20 Claims, 6 Drawing Sheets

DIFFERENTIAL CHARGE PUMP

FIELD OF THE INVENTION

The present invention relates to phase-locked loops (PLLs) generally and, more particularly, to a charge pump that may be used in a PLL.

BACKGROUND OF THE INVENTION

Phase-locked loop (PLL) based clock recovery systems often employ charge pumps as internal circuitry. A low static phase offset in the PLL leads to longer possible transmission lengths due to the more ideal sampling point of the incoming data.

Referring to FIG. 1, a circuit 10 illustrating a typical charge pump is shown. The circuit 10 receives a signal PUMPUP and PUMPDN, which can be divided into pairs of signals PUMPUPP and PUMPUPN, and PUMPDND and PUMPDNN, respectively. The non-filter drain of the current steering differential pairs is tied to a fixed voltage (i.e., VMID) which is most likely different from the other drain of the differential pair (i.e., FILTU and FILTD). When the signal PUMPUP and the signal PUMPDN transition, the sources of the differential pairs (i.e., NSRC_P_U, NSRC_N_U, NSRC_P_D, and NSRC_N_D) move from one voltage to another, based upon the difference between the signals FILTU and FILTD and the signal VMID. The greater the difference between the signals FILTU/FILTD and the signal VMID, the more the source nodes move. The net result is a mismatch between the signal FILTU_PUMP and the signal FILTD_PUMP. The common mode correction circuit (i.e., the transistors connected to the signals CM_PBIAS and CM_BIAS) may cancel some not all the mismatch. The rest of the mismatch results in static phase offset.

Another disadvantage with the circuit 10 is the lack of cascoded current sources. Due to the low output impedance of a single device, noticeable current variations can occur with changes in the signals FILTU and FILTD. This can also result in static phase offset. The use of the signal VMID on the gate of one side of the differential pair reduces the operating frequency of the pump, which becomes significant at lower voltages. Using differential switching increases the operating frequency of the device, or allows the same operating frequency at lower operating voltages. In addition, two common mode signals are needed (i.e., $CM_{13}$ PBIAS and CM_NBIAS). This increases the complexity of the common mode control circuit.

Referring to FIG. 2, a circuit 50 is shown illustrating another conventional buffering method. The circuit 50 comprises a voltage source 52, a voltage source 54, a switch S1, a switch S2, a switch S3, a switch S4 and a comparator 56. The circuit 50 is a single-ended system, which is more sensitive to voltage supply noise and has a smaller dynamic range of operation when compared with the circuit of FIG. 1. The smaller dynamic range of operation requires a voltage controlled oscillator (VCO) to have a higher gain, which in turn increases the noise sensitivity.

SUMMARY OF THE INVENTION

The present invention concerns a circuit and method comprising a charge pump having a first and a second differential element. The charge pump may be configured to generate a first and a second output signal in response to the first and second differential elements. The first differential element may comprise (i) a first unity gain buffer and (ii) a first and a second transistor pair configured to receive a first and second control signal. The second differential element may comprise (i) a second unity gain buffer and (ii) a third and a fourth transistor pair configured to receive the first and second control signals. The first and second unity gain buffers may stabilize the source nodes of each of the transistors pairs.

The objects, features and advantages of the present invention include a charge pump that may be used in a phase-locked loop that may provide (i) reduced static phase offset,(ii) fewer noise sources, (iii) an increased operating frequency that may compensate for lower supply voltages, (iv) lower voltage operation, and (v) may be implemented using a smaller die area.

BRIEF DESCRIPTION OF THE DRAWINGS

These and other objects, features and advantages of the present invention will be apparent from the following detailed description and the appended claims and drawings in which:

DETAILED DESCRIPTION OF PREFERRED EMBODIMENTS

Figure 1:
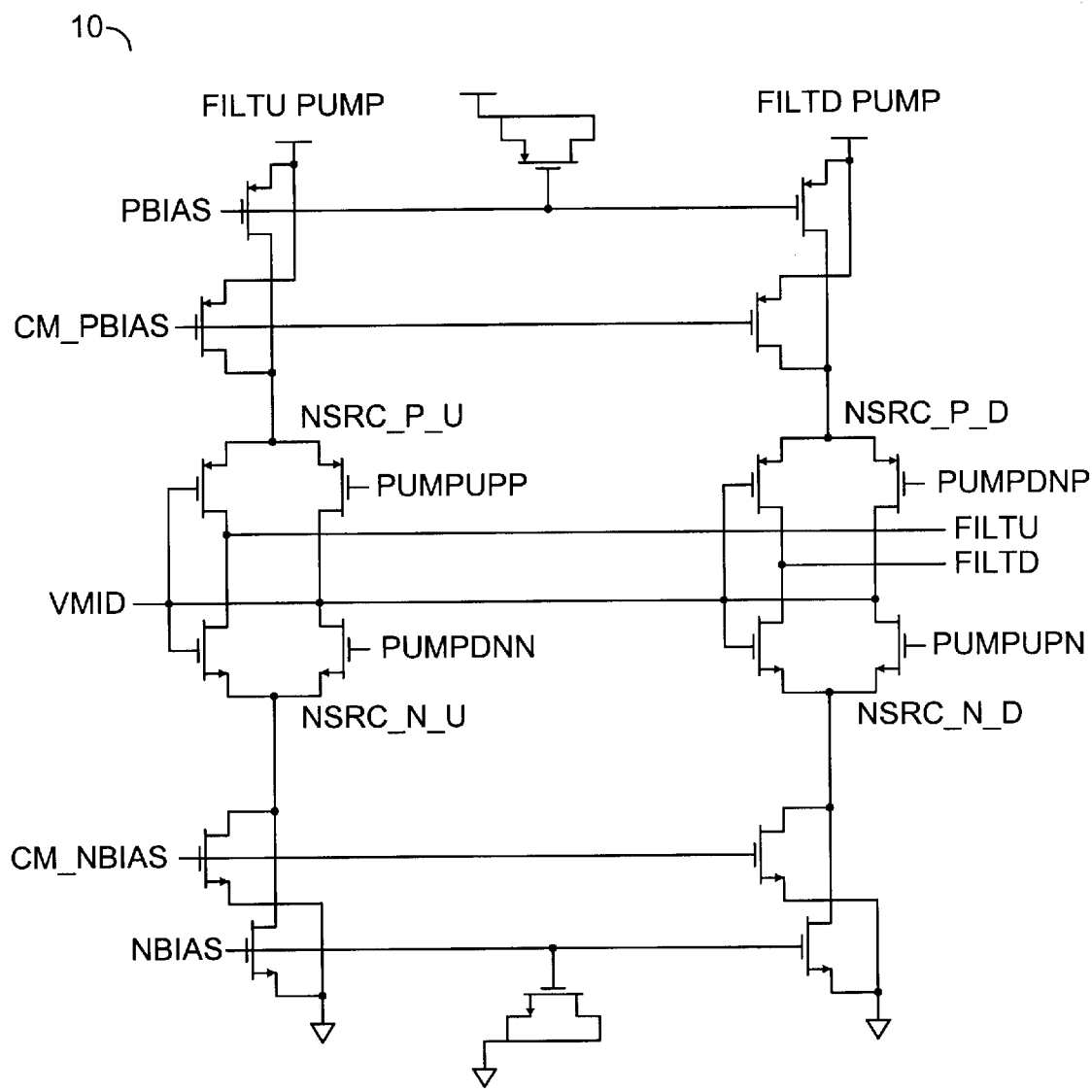
FIG. 1 is a circuit diagram of a conventional charge pump.
Figure 2:
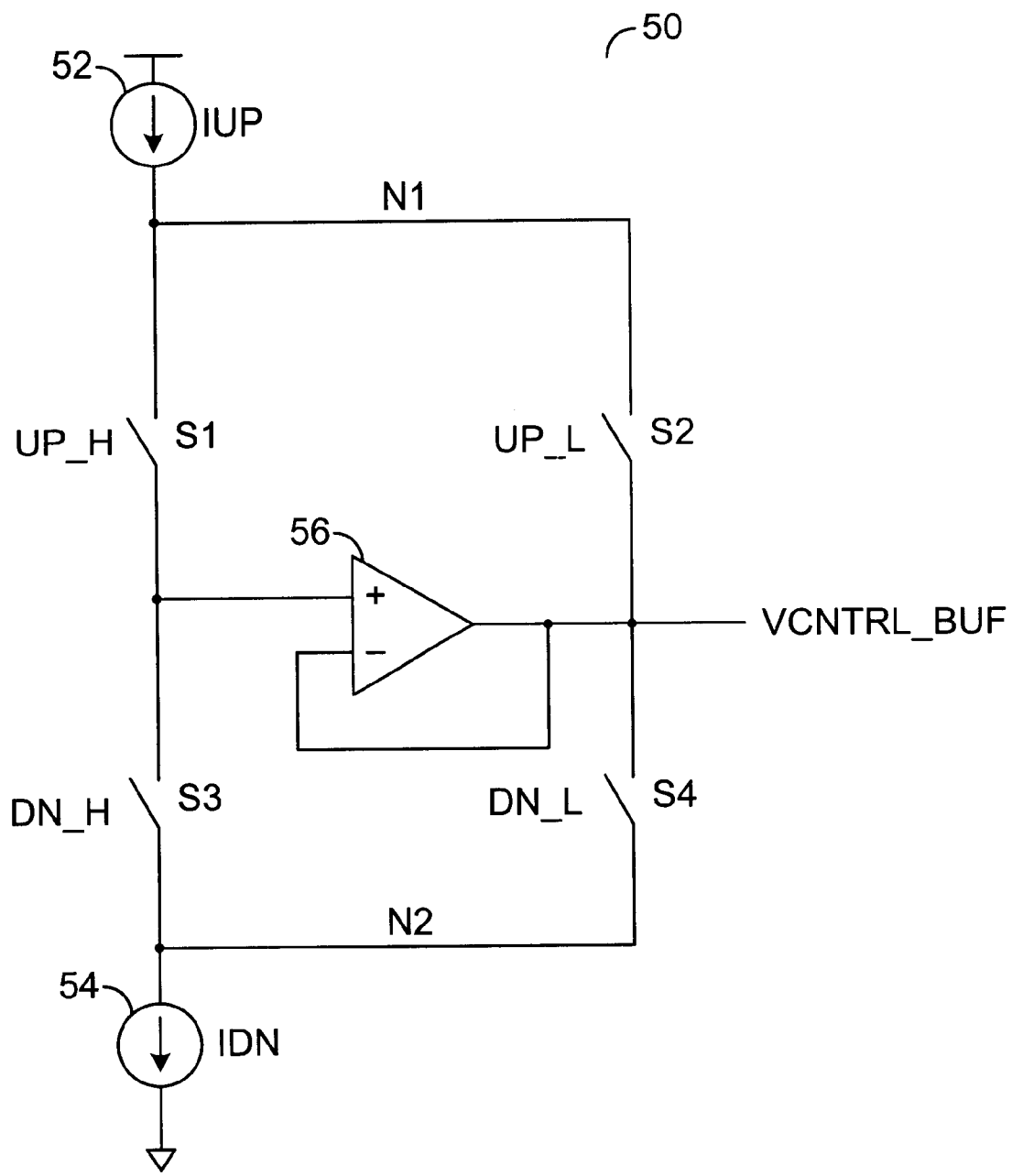
FIG. 2 is a circuit diagram of a conventional buffering scheme.
Figure 3:
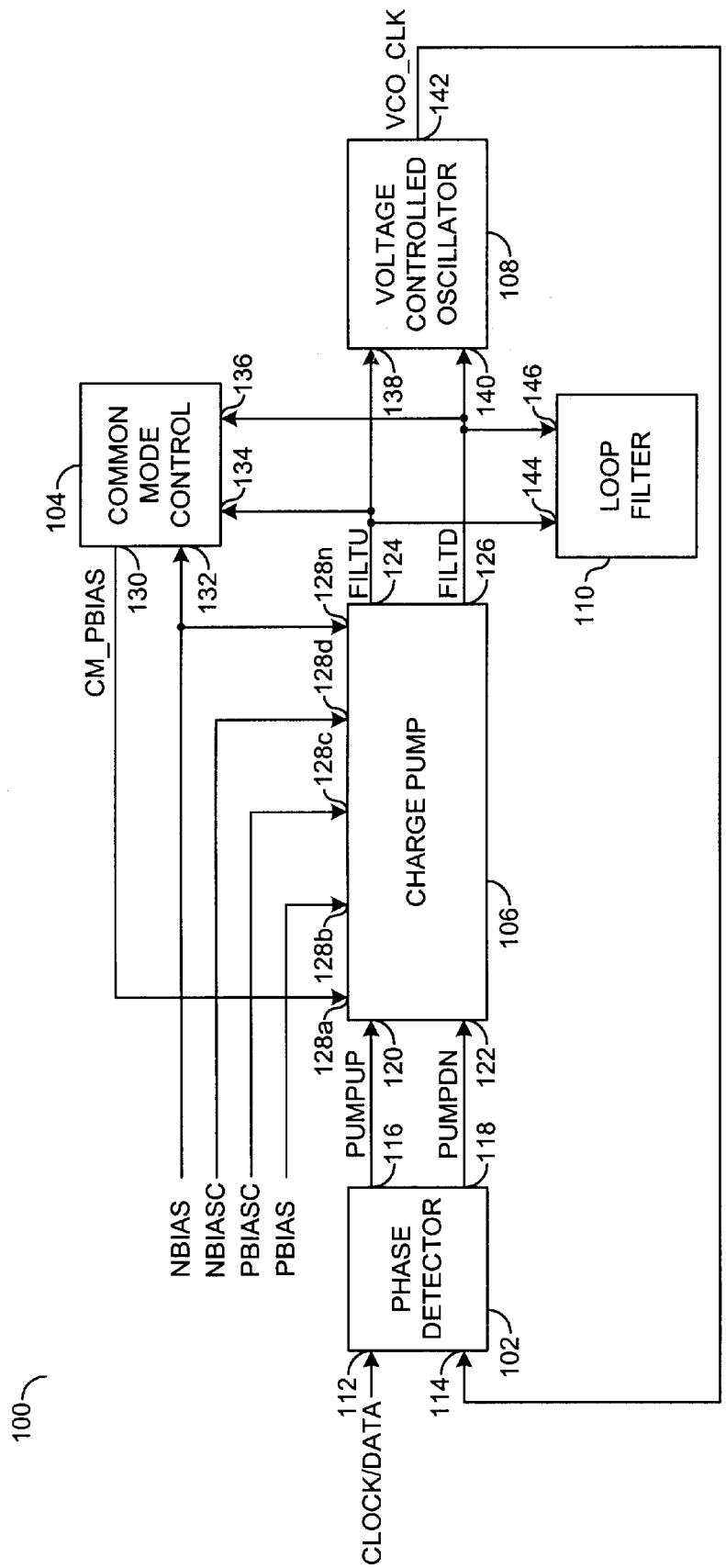
FIG. 3 is a block diagram of a preferred embodiment of the present invention.

Referring to FIG. 3, a block diagram of a circuit 100 is shown in accordance with a preferred embodiment of the present invention. The circuit 100 generally comprises a phase detector block (or circuit) 102, a common mode control block (or circuit) 104, a charge pump block (or circuit) 106, a voltage controlled oscillator (VCO) block (or circuit) 108 and a loop filter block (or circuit) 110. The phase detector 102 generally comprises an input 112 that may receive a data signal (e.g., CLOCK/DATA), an input 114 that may receive a clock signal (e.g., VCO_CLK) from the VCO block 108, an output 116 that may present a first control signal (e.g., PUMPUP) and an output 118 that may present a second control signal (e.g., PUMPDN). The charge pump 106 generally comprises an input 120 that may receive the signal PUMPUP, an input 122 that may receive the signal PUMPDN, an output 124 that may present a control signal (e.g., FILTU) and an output 126 that may present a control signal (e.g., FILTD). The charge pump 106 may also comprise a number of input 128a–128n that may receive a number of bias signals. For example, the input 128a may receive a bias signal (e.g., $CM_{13}$ PBIAS) that may be generated by the common mode control block 104. The input 128b may receive a bias signal (e.g., PBIAS), the input 128c may receive a bias signal (e.g., PBIASC), the input 128d may receive a bias signal (e.g., NBIASC) and the input 128n may receive a bias signal (e.g., NBIAS).

The common mode control block 104 generally comprises an output 130 that may present the signal CM_PBIAS, an input 132 that may receive the signal NBIAS, an input 134 that may receive the signal FILTU and an input 136 that may receive the signal FILTD. The voltage controlled oscillator block 106 generally comprises an input 138 that may receive the signal FILTU, an input 140 that may receive the signal FILTD and an output 142 that may present the signal VCO_CLK. The loop filter block 110 generally comprises an input/output 144 that may be connected to the output 124 of the charge pump 106 and an input/output 146 that may be connected to the output 126 of the charge pump 106.

The signals NBIAS, PBIAS, NBIASC and PBIASC may be generated by an external circuit, such as an analog bias circuit.

The signal CM_PBIAS may be a common mode bias signal that may be presented to the charge pump 106. The loop filter 108 may comprise a number of resistors and/or capacitors.

Figure 4:
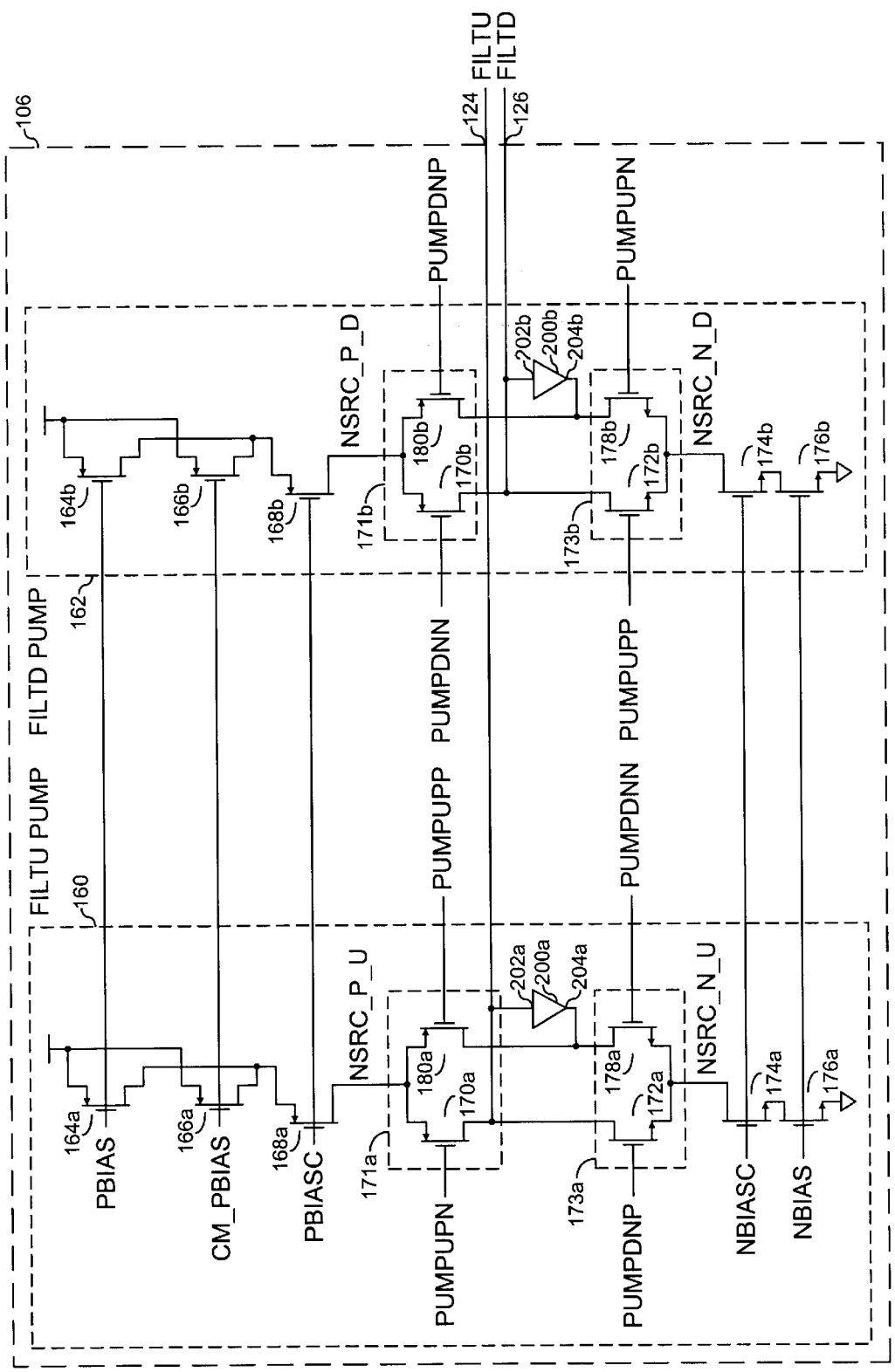
FIG. 4 is a circuit diagram of an example of the charge pump of FIG. 3.

Referring to FIG. 4, a more detailed diagram of the charge pump circuit 106 is shown. The charge pump circuit 106 generally comprises a first differential element 160 and a second differential element 162. The first differential element 160 generally presents the signal FILTU at the output 124, while the second differential element 162 generally presents the signal FILTD at the output 126. The first differential element 160 generally comprises a transistor 164a, a transistor 166a, a transistor 168a, a transistor 170a, a transistor 172a, a transistor 174a, a transistor 176a, a transistor 178a, a transistor 180a and a unity gain buffer circuit 200a. The transistors 170a and 180a generally form a differential pair 171a. The transistors 172a and 178a generally form a differential pair 173a. The transistors 170b and 180b generally form a differential pair 171b. The transistors 172b and 178b generally form a differential pair 173b.

The unity gain buffer circuit 200a has an input 202a and an output 204a and will be described in more detail in connection with FIG. 5. The transistor 164a generally comprises a gate that may receive the signal PBIAS. The transistor 166a generally has a gate that may receive the signal CM_PBIAS. The transistor 168a generally has a gate that may receive the signal PBIASC. The transistor 170a may have a gate that may receive the signal PUMPUPN. The transistor 172a generally comprises a gate that may receive the signal PUMPDNP. The transistor 174a generally comprises a gate that may receive the signal NBIASC. The transistor 176a generally comprises a gate that may receive the signal NBIAS. The transistor 178a generally comprises a gate that may receive the signal PUMPDNN. The transistor 180a generally comprises a gate that may receive the signal PUMPUPP. The signal PUMPUPN and PUMPUPP generally comprise a differential input that may be presented to the transistors 170a and 180a, respectively, of the differential pair 171a. Similarly, the signals PUMPDNP and PUMPDNN generally comprise a differential input that is presented to the transistors 172a and 178a, respectively, of the differential pair 173a.

The differential element 162, generally comprises a transistor 164b, 166b, 168b, 170b, 172b, 174b, 176b, 178b, 180b and a unity gain buffer 200b. The transistors 164b–180b and the unity gain buffer 200b have similar connections to the transistors 164a–180a and the unity gain buffer 200a of the differential element 160. However, the transistor 170b generally receives the signal PUMPDNN, the transistor 172b generally receives the signal PUMPUPP, the transistor 178b generally receives the signal PUMPUPN and the transistor 180b generally receives the signal PUMPDNP.

The unity gain buffers 200a and 200b generally force the drains at both sides of the individual differential transistor pairs (e.g., 173a or 173b) to be equal. This generally minimizes the switching transients on the source nodes of the differential pairs (e.g., the pairs 171a, 171b, 173a and 173b) that may be created when the signals PUMPUP and PUMPDN transition from one side to the other. This may lead to a mismatch between the signal FILTU and the signal FILTD, which may result in lower static phase offset. To compensate, the cascoded current sources may increase the output impedance of the current sources (e.g., the transistors 168a and 168b), which may reduce variation in current due to differences in the signals FILTU and FILTD, which may, in turn, reduce the static phase offset. The simplified common mode biasing may result in smaller die area and fewer noise sources. Driving the differential pairs (e.g., the pairs 171a, 171b, 173a and 173b) with differential signals increases the operating frequency of the device, compensating for performance loss at lower voltage operation (e.g., 3.3V or less).

Figure 5:
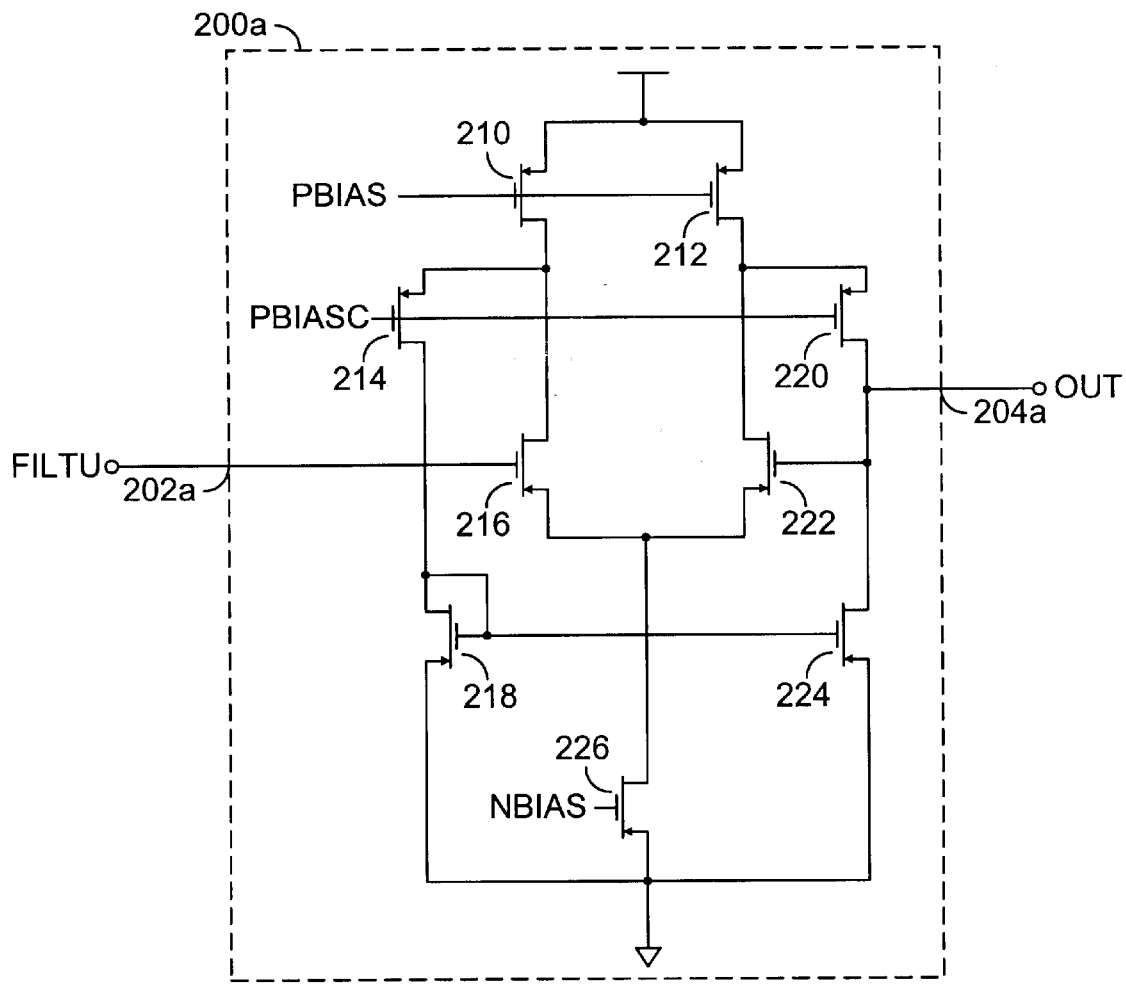
FIG. 5 is a circuit diagram of an example of the unity gain buffer of FIG. 3.

Referring to FIG. 5, a circuit diagram of the unity gain buffer 200a is shown. The unity gain buffer 200b may have similar connections. The unity gain buffer 200a generally comprises a transistor 210, a transistor 212, a transistor 214, a transistor 216, a transistor 218, a transistor 220, a transistor 222, a transistor 224 and a transistor 226. The transistors 210 and 212 generally receive the signal PBIAS. The transistors 214 and 220 generally receive the signal PBIASC. The transistor 216 generally receives the signal FILTU. The gate of the transistor 222 as well as the drain of the transistors 220 and 224 generally present the signal OUT at the output 204a. The transistor 218 is generally connected between the transistor 214 and ground. The transistor 224 is generally coupled between the transistor 220 and ground. The transistor 226 is generally coupled between the sources of the transistors 216 and 222 and ground. While the circuit 200 shows one example of a unity gain buffer, other buffers that provide similar functioning (e.g., providing a uniform voltage) may be used accordingly to meet the design criteria of a particular implementation.

Figure 6:
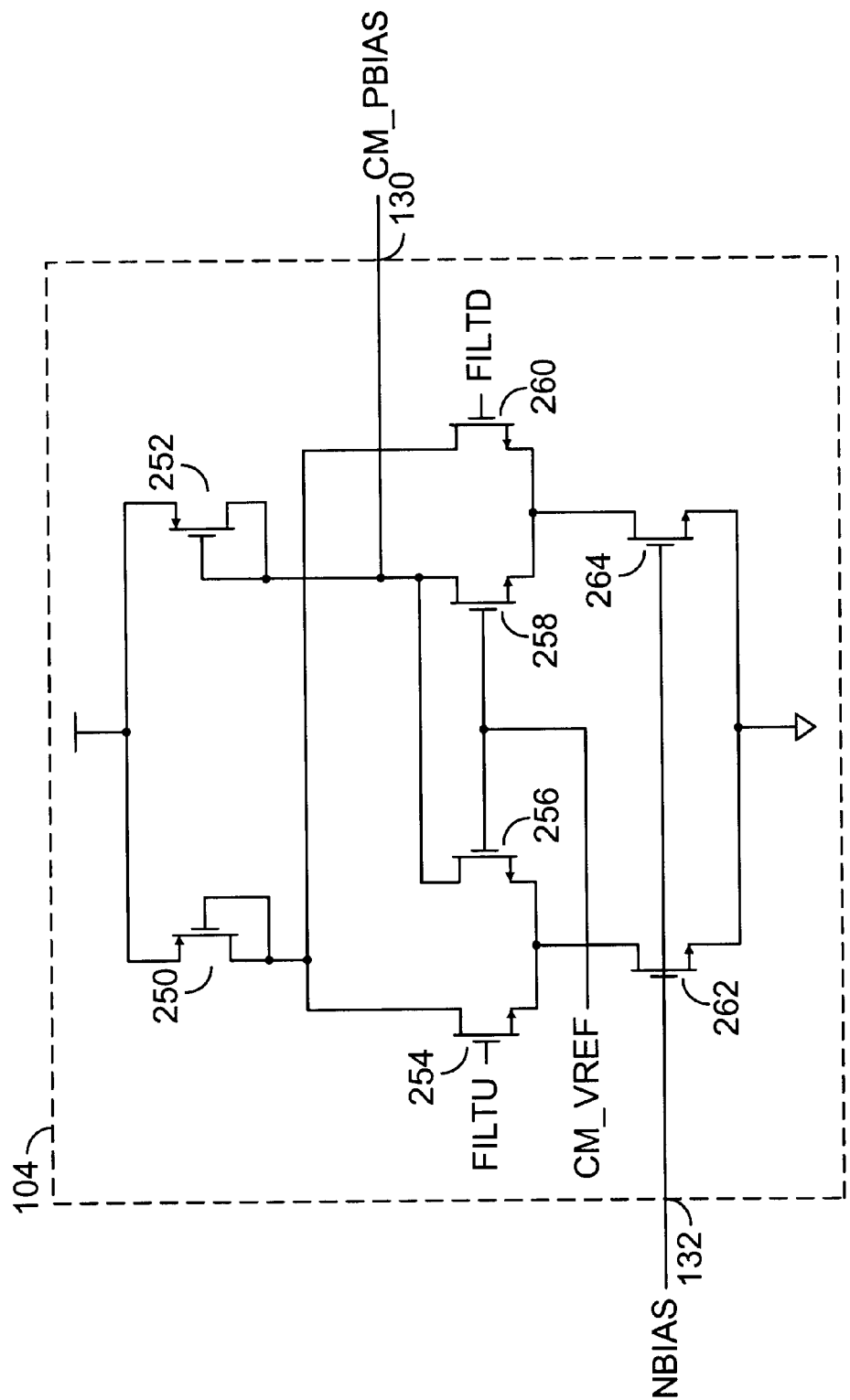
FIG. 6 is a circuit diagram of an example of the common mode control circuit of FIG. 3.

Referring to FIG. 6, a more detailed diagram of the common mode circuit 104 is shown. The common mode circuit 104 generally comprises a transistor 250, a transistor 252, a transistor 254, a transistor 256, a transistor 258, a transistor 260, a transistor 262 and a transistor 264. The transistor 254 may receive the signal FILTU and the transistor 260 may receive the signal FILTD. The gates of the transistors 256 and 258 may receive the signal CM_VREF. The transistors 262 and 264 may receive the signal NBIAS. The drains of the transistors 256 and 258 as well as the drain and gate of the transistor 252 may present the signal CM_PBIAS. The transistor 250 may be coupled between a supply voltage and the drains of the transistors 254 and 260. The transistor 252 may be connected between the supply voltage and the drains of the transistors 256 and 258. The transistors 262 and 264 may be connected between ground and the sources of the transistors 254 and 256 and the sources of the transistors 258 and 260, respectively.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a charge pump configured to generate a first and a second output signal in response to (a) a first differential element comprising (i) a first unity gain buffer and (ii) a first and a second transistor pair configured to receive a first and second control signal and (b) a second differential element comprising (i) a second unity gain buffer and (ii) a third and a fourth transistor pair configured to receive said first and a second control signals, wherein (i) said first unity gain buffer has an input configured to receive said first output signal and an output coupled to drains/sources of said first and second transistor pairs and (ii) said second unity gain buffer has an input configured to receive said second output signal and an output coupled to drains/sources of said third and fourth transistor pairs.

2. The circuit according to claim 1, wherein said first control signal comprises a first differential input and said second control signal comprises a second differential input.

3. The circuit according to claim 1, wherein:
said first control signal comprises a first differential portion that is a digital complement of a second differential portion; and
said second control signal comprises a first differential portion that is a digital complement of a second differential portion.

4. The circuit according to claim 2, further comprising:
a voltage controlled oscillator configured to present a third output in response to said first and a second differential inputs.

5. The circuit according to claim 1, wherein said charge pump is configured to present said first and said second output signals in further response to one or more bias signals.

6. The circuit according to claim 5, further comprising:
a control circuit configured to present one of said bias signals in response to (i) another one of said bias signals and (ii) said first and second output signals.

7. The circuit according to claim 4, further comprising:
a phase detector configured to present said control signals in response to (i) a data input signal and (ii) said third output signal.

8. The circuit according to claim 1, further comprising a loop filter.

9. The circuit according to claim 5, wherein said first differential element presents said first tput signal and said second differential element presents said second output signal.

10. The circuit according to claim 9, wherein said first and second differential elements present said first and second output signals in response to said bias signals.

11. A circuit comprising:
means for generating a first and a second output signal comprising a charge pump having (a) a first differential element comprising (i) a first unity gain buffer and (ii) a first and a second transistor pair configured to receive a first and a second control signal and (b) a second differential element comprising (i) a second unity gain buffer and (ii) a third and a fourth pair of transistors configured to receive said first and second control signals, wherein (i) said first unity gain buffer has an input configured to receive said first output signal and an output coupled to drains/sources of said first and second transistor pairs and (ii) said second unity gain buffer has an input configured to receive said second output signal and an output coupled to drains/sources of said third and fourth transistor pairs.

12. A method for generating a first and a second output signal comprising:
(A) generating said first output signal in response to (a) a first differential element comprising (i) a first unity gain buffer and (ii) a first and a second transistor pair; and
(B) generating said second output signal in response to a second differential element comprising (i) a second unity gain buffer and (ii) a third and a fourth transistor pair, wherein (i) said first unity gain buffer has an input configured to receive said first output signal and an output coupled to drains/sources of said first and said second transistor pairs and (ii) said second unity gain buffer has an input configured to receive said second output signal and an output coupled to drains/sources of said third and said fourth transistor pairs.

13. The method according to claim 12, wherein step (A) generates said first output in further response to a first and a second control signal.

14. The method according to claim 13, wherein said first control signal comprises a differential input and said second control signal comprises a second differential input.

15. The method according to claim 13, wherein said first control signal comprises a first differential portion and said second control signal comprises a second differential portion that is a digital complement of said first differential portion.

16. The method according to claim 13, wherein said second control signal comprises a first differential portion and a second differential portion that is a digital complement of said first differential portion.

17. The method according to claim 14, further comprising the step of:
generating a third output in response to said first and second differential inputs.

18. The method according to claim 17, further comprising the step of:
generating said first and second control signals in response to (i) a data input signal and (ii) said third output signal.

19. The method according to claim 15, further comprising the step of:
generating said first and second control signals in further response to one or more bias signals.

20. The method according to claim 13, wherein step (B) generates said second output in further response to said first and second control signals.

* * * * *